(12) United States Patent
Tsuchiya et al.

(10) Patent No.: US 7,285,858 B2
(45) Date of Patent: Oct. 23, 2007

(54) SEMICONDUCTOR DEVICE AND ITS MANUFACTURE METHOD CAPABLE OF PREVENTING SHORT CIRCUIT OF ELECTRODES WHEN SEMICONDUCTOR DEVICE IS MOUNTED ON SUB-MOUNT SUBSTRATE

(75) Inventors: Masahiko Tsuchiya, Tokyo (JP); Naochika Horio, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 125 days.

(21) Appl. No.: 10/962,109

(22) Filed: Oct. 7, 2004

(65) Prior Publication Data

US 2005/0104220 A1    May 19, 2005

(30) Foreign Application Priority Data

Nov. 14, 2003    (JP) .............................. 2003-385645

(51) Int. Cl.
*H01L 23/48* (2006.01)
(52) U.S. Cl. ............... 257/753; 257/773; 257/E23.019; 438/628
(58) Field of Classification Search ................ 257/753, 257/763–764, 768–770, 773–784, E23.01; 438/683, 685, 628
See application file for complete search history.

(56) References Cited

U.S. PATENT DOCUMENTS 5,197,654 A * 3/1993 Katz et al. ............... 228/124.1
5,227,812 A * 7/1993 Watanabe et al. ............. 347/50
5,990,560 A * 11/1999 Coult et al. .................. 257/772
6,632,028 B1 * 10/2003 Yang et al. .................... 385/88
7,072,374 B2 * 7/2006 Matsumura ............... 372/46.01
7,092,423 B2 * 8/2006 Kume et al. ........... 372/45.013
2001/0040290 A1 * 11/2001 Sakurai et al. .............. 257/737
2003/0102570 A1 * 6/2003 Imasu et al. ................ 257/778

FOREIGN PATENT DOCUMENTS

| JP | 3292044 B2 | 3/1992 |
| JP | 2770717 B2 | 4/1998 |
| JP | 2914065 B2 | 4/1999 |
| JP | 3255281 B2 | 11/2001 |
| JP | 2003-031851 A | 1/2003 |

* cited by examiner

*Primary Examiner*—Phat X. Cao
*Assistant Examiner*—Abul Kalam
(74) *Attorney, Agent, or Firm*—Frishauf, Holtz, Goodman & Chick, P.C.

(57) ABSTRACT

A confronting surface of a substrate faces a first surface of a semiconductor element. Extension layers are formed on the substrate at positions facing electrodes on the semiconductor element. A levee film is disposed on one of the confronting surface and the first surface. Openings are formed through the levee film. Connection members which is filled but is not completely filled in the openings connect the electrodes and the extension layers.

8 Claims, 12 Drawing Sheets

SEMICONDUCTOR DEVICE AND ITS MANUFACTURE METHOD CAPABLE OF PREVENTING SHORT CIRCUIT OF ELECTRODES WHEN SEMICONDUCTOR DEVICE IS MOUNTED ON SUB-MOUNT SUBSTRATE

CROSS REFERENCE TO RELATED APPLICATION

This application is based on and claims priority of Japanese Patent Application No. 2003-385645 filed on Nov. 14, 2003, the entire contents of which are incorporated herein by reference.

BACKGROUND OF THE INVENTION

A) Field of the Invention

The present invention relates to a semiconductor device and its manufacture method, and more particularly to a semiconductor device mounted on a support substrate (sub-mount substrate) and its manufacture method.

B) Description of the Related Art

FIG. 12 is a cross sectional view of a semiconductor light emitting device and a sub-mount substrate disclosed in Japanese Patent Laid-open publication No. 2003-31851. A semiconductor light emitting device 210 is mounted on a sub-mount substrate 200. The sub-mount substrate 200 is constituted of an auxiliary n-side electrode layer 203 and an auxiliary p-side electrode layer 204 formed on the surface of a silicon substrate 201. An oxide coating film 202 is disposed between the auxiliary n-side electrode layer 203 and silicon substrate 201 to electrically insulate the auxiliary n-side electrode layer 203 and silicon substrate 201. The auxiliary p-side electrode layer 204 is formed directly on the surface of the silicon substrate 201. For example, the auxiliary electrode layers 203 and 204 are made of alloy of Au and Sn or indium contained alloy.

On the surface of the semiconductor light emitting device 210 using a sapphire substrate and facing the sub-mount substrate 200, an n-side electrode 211 and a p-side electrode 212 are formed. The n-side electrode 211 is soldered to the auxiliary n-side electrode layer 203, and the p-side electrode 212 is soldered to the auxiliary p-side electrode layer 204.

The silicon substrate 201 is mounted on a p-side terminal portion 220a of a lead frame 220. The auxiliary n-side electrode 203 is connected to an n-side terminal portion of the lead frame 220 by a wire 221.

Light emitted from the semiconductor light emitting device 210 is irradiated through the sapphire substrate toward the side opposite to the sub-mount substrate 200.

Japanese Patent Publications No. 2914065, No. 2770717 and No. 3292044 disclose techniques of covering a surface of a semiconductor light emitting device with an insulating protective film. Japanese Patent Publication No. 3255281 discloses techniques of inserting an adhesion reinforcing layer of Ti, Ni, W or the like between an electrode and a protective film.

When the semiconductor light emitting device 210 shown in FIG. 12 is mounted on the sub-mount substrate 200, the p-side electrode and n-side electrode are short-circuited in some cases by melted and laterally flowed AuSn alloy or the like. This short circuit cannot be prevented even if the semiconductor light emitting device is covered with a protective film.

SUMMARY OF THE INVENTION

An object of this invention is to provide a semiconductor device and its manufacture method capable of preventing a short circuit of electrodes when the semiconductor device is mounted on a sub-mount substrate.

According to one aspect of the present invention, there is provided a semiconductor device comprising: a semiconductor element having first and second electrodes formed on a first surface; a sub-mount substrate disposed so that a confronting surface of the sub-mount substrate faces the first surface of the semiconductor element, the sub-mount substrate having first and second extension layers disposed at positions facing the first and second electrodes; a levee film made of insulating material and disposed at least on a partial area of at least one of the confronting surface of the sub-mount substrate and the first surface of the semiconductor element, the levee film having first and second openings formed therethrough at positions corresponding to the first and second electrodes; a first connection member for electrically connecting the first electrode and the first extension layer via the first opening and not completely burying an inside of the first opening; and a second connection member for electrically connecting the second electrode and the second extension layer via the second opening and not completely burying an inside of the second opening.

According to another aspect of the present invention, there is provided a semiconductor device comprising: a semiconductor element having first and second electrodes formed on a first surface; a sub-mount substrate disposed facing the first surface of the semiconductor element, the sub-mount substrate having first and second extension layers disposed at positions facing the first and second electrodes, respectively; an insulating member made of insulting material and surrounding a first space defined between a confronting surface of the first electrode and a confronting surface of the first extension layer to form a closed space continuous from the confronting surface of the first electrode to the confronting surface of the first extension layer, and surrounding a second space defined between a confronting surface of the second electrode and a confronting surface of the second extension layer to form a closed space continuous from the confronting surface of the second electrode to the confronting surface of the second extension layer; a first connection member disposed in the first space for electrically connecting the first electrode and the first extension layer; and a second connection member disposed in the second space for electrically connecting the second electrode and the second extension layer.

According to still another aspect of the present invention, there is provided a semiconductor device manufacture method comprising steps of: preparing a first substrate having first and second electrodes formed on a first surface, third and fourth connection members being formed on the first and second electrodes, respectively; preparing a second substrate having a second surface on which fifth and sixth connection members are formed at positions corresponding to the third and fourth connection members when the second surface is disposed facing the first surface of the first substrate, the fifth and sixth connection members being covered with a levee film made of insulating material, first and second openings being formed through the levee film to expose upper surfaces of the fifth and sixth connection members, and as viewed along a line of sight parallel to a normal to the first surface, the third connection member being positioned inside the first opening and the fourth connection member being positioned inside the second opening; and making the third connection member contact the fifth connection member via the first opening and the fourth connection member contact the sixth connection member via the second opening, and making eutectic a contact region between the third connection member and the fifth connection member and a contact region between the fourth connection member and the sixth connection member.

According to still another aspect of the present invention, there is provided a semiconductor device comprising: a first substrate having a first surface on which third and fourth connection members are formed, the third and fourth connection members each comprising a lamination structure of a lower layer, a middle layer and an upper layer sequentially stacked from the first surface, the lower layer being made of a metal selected from a group consisting of nickel, titanium, tungsten and molybdenum, the middle layer being made of platinum and the upper layer being made of gold; and a second substrate having a second surface and disposed so as to make the second surface face the first surface of the first substrate, the second substrate comprising fifth and sixth connection members formed on the second surface at positions facing the third and fourth connection members, the fifth and sixth connection members each comprising a lamination structure of a lower layer, a middle layer and an upper layer sequentially stacked from the second surface, the lower layer being made of a metal selected from a group consisting of nickel, titanium, tungsten and molybdenum, the middle layer being made of platinum and the upper layer comprising a lamination structure of gold layers and tin layers alternately stacked, wherein an upper surface of the third connection member contacts the upper surface of the fifth connection member to make a contact region eutectic, and an upper surface of the fourth connection member contacts the upper surface of the sixth connection member to make a contact region eutectic.

When a semiconductor device is mounted on a sub-mount substrate, a portion of the connection member is melted. The melted metal remains in an opening formed by the levee film so that a short circuit between electrodes can be prevented.

DESCRIPTION OF THE PREFERRED EMBODIMENTS

Figure 1:
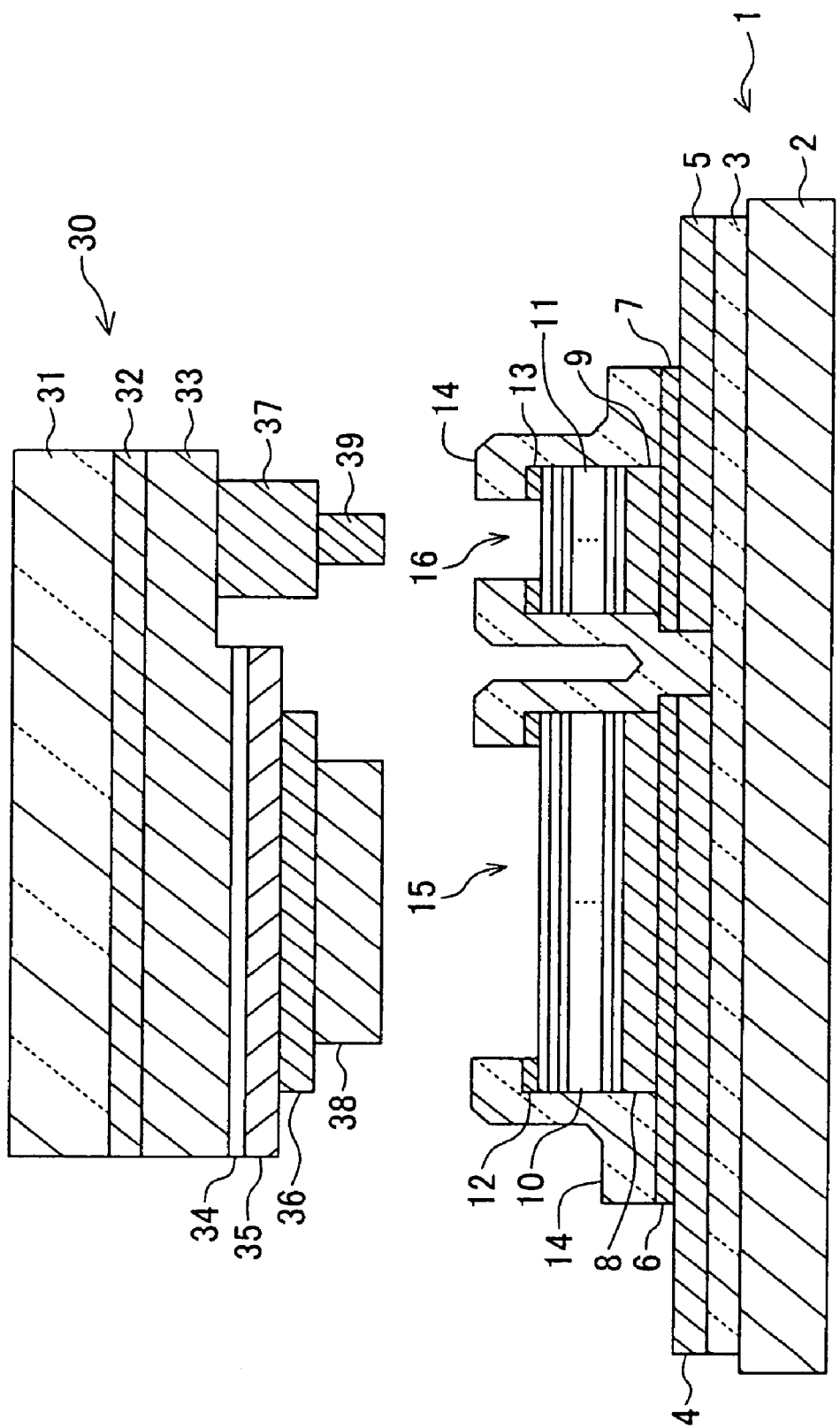
FIG. 1 is a cross sectional view showing the state of a semiconductor device before mounting according to a first embodiment.
Figure 2:
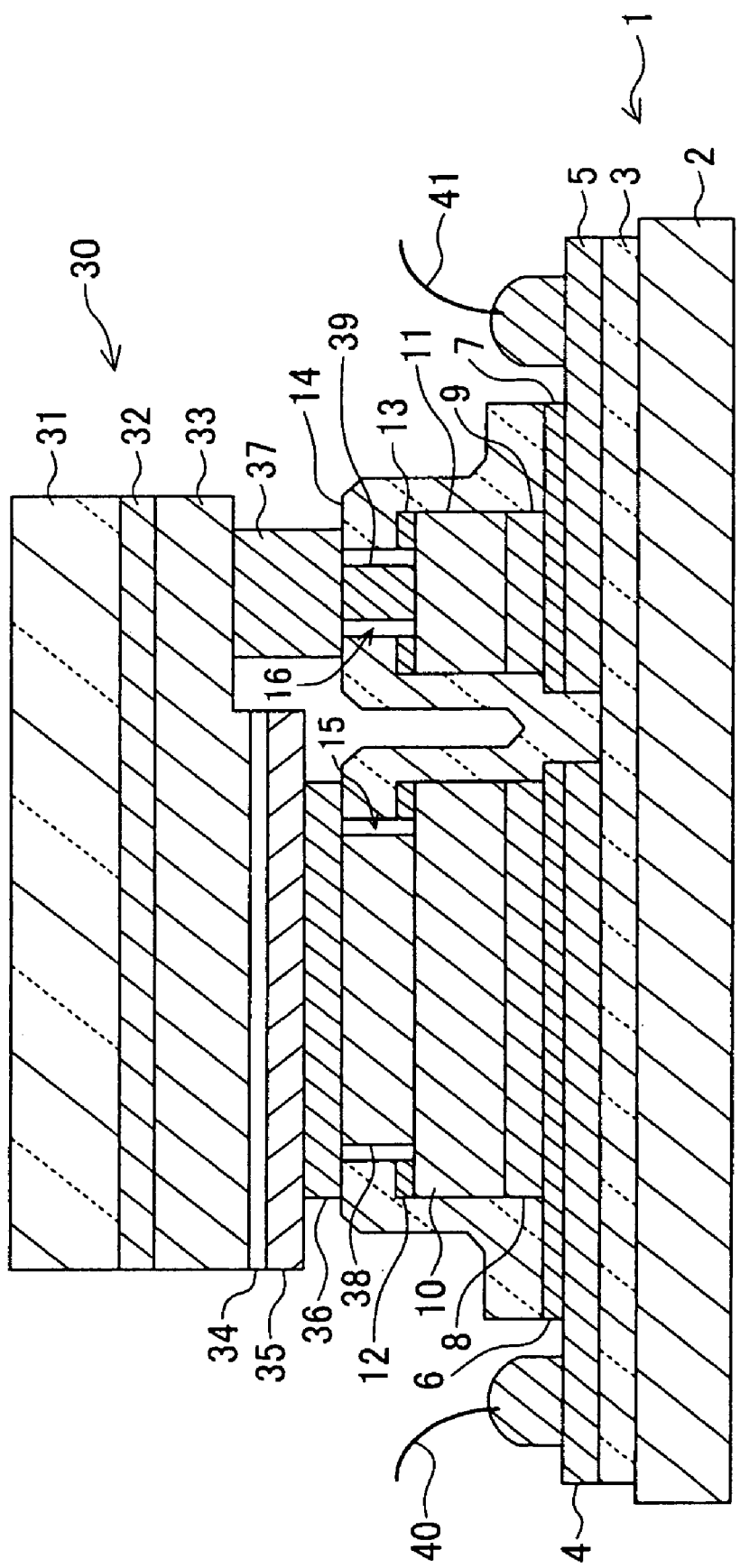
FIG. 2 is a cross sectional view showing the semiconductor device after mounting according to the first embodiment.

With reference to FIGS. 1 and 2, description will be made on a semiconductor device and its manufacture method according to the first embodiment.

As shown in FIG. 1, the semiconductor device of the first embodiment is constituted of a sub-mount substrate 1 and a semiconductor light emitting device 30.

The structure of the sub-mount substrate 1 will be described. On the principal surface of an underlying substrate 2 made of silicon or the like, an insulating film 3 is formed which is made of silicon oxide and has a thickness of 300 nm. Formed on the insulating film 3 are an extension layer 4 to be connected to a p-side electrode of the semiconductor light emitting device 30 and an extension layer 5 to be connected to an n-side electrode. The extension layers 4 and 5 have a two-layer structure of, for example, a titanium (Ti) layer having a thickness of 10 nm and a gold (Au) layer having a thickness of 1000 nm. The two-layer structure of the extension layers 4 and 5 may be made of a nickel (Ni) layer and an Au layer.

Adhesion layers 6 and 7 are formed on the extension layers 4 and 5, respectively. For example, the adhesion layers 6 and 7 are made of Ti and have a thickness of 10 nm. Partial areas of the upper surfaces of the adhesion layers 4 and 5 are exposed to connect lead wires.

On a partial area of the upper surface of the p-side adhesion layer 6, a barrier layer 8, a connection member 10 and an adhesion layer 12 are stacked in this order. Also on a partial area of the upper surface of the n-side adhesion layer 7, a barrier layer 9, a connection member 11 and an adhesion layer 13 are stacked in this order. The barrier layers 8 and 9 have a three-layer structure of a Ti layer of 10 nm in thickness, an Au layer of 100 nm in thickness and a platinum (Pt) layer of 100 nm in thickness stacked in this order from the underlying substrate 2 side. The connection members 10 and 11 have a lamination structure having Au layers and tin (Sn) layers disposed alternately. The uppermost and lowermost layers are both the Au layer. For example, the thicknesses of the Au layer and Sn layer were set to 75.5 nm and 109.4 nm, and six Au layers and five Sn layers were stacked. The thicknesses of the Au layer and Sn layer may be set to 50 to 200 nm. The adhesion layer 12 is made of Ti and has a thickness of 10 nm.

The barrier layers 8 and 9 may have the three-layer structure of tungsten (W)/Au/Pt or molybdenum (Mo)/Au/Pt. The notation "X/N/Z" means that X is the lowermost layer, Y is the middle layer and Z is the uppermost layer.

A levee film 14 covers the p-side adhesion layers 6 and 12, p-side connection member 10, barrier layer 8, insulating film 3 between the p-side extension layer 4 and n-side extension layer 5, n-side adhesion layers 7 and 13, n-side connection member 11 and barrier layer 9. For example, the levee film 14 is made of silicon oxide and has a thickness of 500 nm to 3000 nm.

An opening 15 exposing partially the upper surface of the p-side connection member 10 is formed through the levee film 14 and adhesion layer 12, and an opening 16 exposing partially the upper surface of the n-side connection member 11 is formed through the levee film 14 and adhesion layer 13.

Next, the structure of the semiconductor light emitting device 30 will be described. On the principal surface of a sapphire substrate 31, an initial nucleus forming layer 32, an n-type semiconductor layer 33, an active layer 34 and a p-type semiconductor layer 35 are stacked in this order. These semiconductor layers are made of, for example, semiconductor nitride such as $In_yAl_{1-x-y}Ga_xN$ (x+y≦1, 0≦x≦1, 0≦y≦1). The active layer 34 and p-type semiconductor layer 35 are partially removed to partially expose the n-type semiconductor layer 33.

A p-side ohmic electrode 36 is formed on the surface of the p-type semiconductor layer 35. An n-side ohmic electrode 37 is formed on the exposed surface of the n-side semiconductor layer 33. For example, the p-side ohmic electrode 36 has a two-layer structure of a Pt layer of 3 nm in thickness and a rhodium (Rh) layer of 100 nm in thickness. For example, the n-side ohmic electrode 37 has a five-layer structure of an Al layer of 3 nm in thickness, an Rh layer of 100 nm in thickness, an Au layer of 100 nm in thickness, a Pt layer of 100 nm in thickness and an Au layer of 100 nm to 2000 nm in thickness sequentially stacked in this order. The thickness of the uppermost Au layer of the n-side ohmic electrode 37 is determined so that the upper surfaces of the p-side ohmic electrode 36 and n-side ohmic electrode 37 become flush relative to the principal surface of the sapphire substrate 31.

The p-side ohmic electrode 36 may have a single layer structure of Pt or Rh, or a two-layer structure of Pt/silver (Ag). Instead of Rh, the second layer of the n-side ohmic electrode 37 may be made of Pt, iridium (Ir), palladium (Pd) or the like.

Pad electrodes (connection members) 38 and 39 are formed on the surfaces of the ohmic electrodes 36 and 37. For example, the pad electrodes 38 and 39 have a four-layer structure of a Ni layer of 3 nm in thickness, an Au layer of 100 nm in thickness, a Pt layer of 100 nm in thickness and an Au layer of 200 nm to 2000 nm in thickness stacked in this order. Instead of Ni, the first layers of the pad electrodes 38 and 39 may be made of Ti, W or Mo. The Au layer as the second layer may be omitted to use a three-layer structure. The heights of the pad electrodes 38 and 39 are set slightly higher than the depths of the openings 15 and 16 (thicknesses of the levee film 14) on the sub-mount substrate 1 side.

Next, a manufacture method for the sub-mount substrate 1 will be described. The underlying substrate 1 is washed to clean the surface thereof. On the principal surface of the underlying substrate 1, an insulating film 3 made of silicon oxide and having a thickness of 300 nm is formed by sputtering. If a silicon substrate having a thermally oxidized film on the surface thereof is used, the insulating film forming process by sputtering can be omitted.

A resist pattern is formed having openings matching the extension layers 4 and 5, and Ti layers and Au layers of the extension layers 4 and 5 and Ti layers of the adhesion layers 6 and 7 are sequentially formed by electron beam vapor deposition. Unnecessary Ti layers and Au layers are removed by lift-off to form the extension layers 4 and 5 and the adhesive layers 6 and 7. Although the adhesion layers 6 and 7 cover the whole surfaces of the lead wring layers 4 and 5 at this time, partial areas of the surfaces of the extension layers 4 and 5 are exposed by a later etching process.

A resist pattern is formed having openings matching the connection members 10 and 11, and the layers from the barrier layers 8 and 9 to the adhesion layers 12 and 13 are deposited by electron beam vacuum deposition. Unnecessary portions of the deposited layers are removed by lift-off to thereby leave the barrier layers 8 and 9, connection members 10 and 11 and adhesion layers 12 and 13.

A silicon oxide film having a thickness of 500 nm to 3000 nm is formed on the whole surface by sputtering. This silicon oxide film is patterned to leave the levee film 14. At this time, the openings 15 and 16 are also formed to partially expose the surfaces of extension layers 4 and 5. The uppermost Au layers of the connection members 10 and 11 are exposed on the bottoms of the openings 15 and 16. Generally, as the silicon oxide film is wet-etched, the side walls of the openings 15 and 16 become oblique so that the bottoms of the openings 15 and 16 are smaller than the opening surfaces (top surfaces). The bottoms of the openings 15 and 16 are made larger than the uppermost surfaces of the pad electrodes 38 and 39 of the semiconductor light emitting device 30.

The silicon substrate 2 is ground and polished to thin it to a thickness of about 100 μm. Scribing and breaking are performed to separate the substrate into sub-mount substrates.

Next, a manufacture method for the semiconductor light emitting device 30 will be described. On the principal surface of the sapphire substrate 31, the initial nucleus forming layer 32, n-type semiconductor layer 33, active layer 34 and p-type semiconductor layer 35 are grown. These layers can be grown by metal organic vapor phase epitaxial growth (MOVPE) or molecular beam epitaxial growth (MBE).

The p-type semiconductor layer 35 and active layer 34 are partially etched to partially expose the n-type semiconductor layer 33. This etching depth is, for example, 700 nm. The p-side ohmic electrode 36 is formed on the surface of the p-type semiconductor layer 35 by electron beam vapor deposition and lift-off. Thereafter, the n-side ohmic electrode 37 is formed on the exposed surface of the n-type semiconductor layer 33 by electron beam vapor deposition and lift-off. The thickness of the uppermost Au layer of the n-side ohmic electrode 37 is set so that the uppermost surface of the n-side ohmic electrode 37 becomes flush with the uppermost surface of the p-side ohmic electrode 36.

The pad electrodes 38 and 39 are formed on the surfaces of the ohmic electrodes 36 and 37, respectively. The sapphire substrate 31 is ground and polished to thin it to a thickness of 100 μm to 230 μm. Thereafter, scribing and breaking are performed to separate the substrate into devices.

Next, description will be made on a procedure of flip-chip bonding the semiconductor light emitting device 30 to the sub-mount substrate 1. The sub-mount substrate 1 and semiconductor light emitting device 30 are disposed facing each other in such a manner that the principal surface of the silicon substrate 2 faces the principal surface of the sapphire substrate 31. The positions of the sub-mount substrate 1 and semiconductor light emitting device 30 are adjusted so that as viewed along the line of sight perpendicular to the principal surface of the silicon substrate 2, the pad electrode 38 is positioned inside the opening 15 and the pad electrode 39 is positioned inside the opening 16.

The pad electrodes 38 and 39 are inserted into the openings 15 and 16, respectively and made in contact with the connection members 10 and 11. The sub-mount substrate 1 and semiconductor light emitting device 30 are pressured and heated to maintain a high temperature, and thereafter cooled. The uppermost Au layer of the pad electrode 38 and the connection member 10 are made eutectic, and the uppermost Au layer of the pad electrode 39 and the connection member 11 are made eutectic. A proper eutectic temperature profile is selected as the heating conditions. The AuSn eutectic metal used in this embodiment has an Sn concentration of 20 wt %. The eutectic point of this eutectic composition is 280 to 300° C. By making eutectic the contact region of the connection member 10 and pad electrode 38 and the contact region of the connection member 11 and pad electrode 39, it is possible to fix the semiconductor light emitting device 30 to the sub-mount substrate 1 and establish an electric connection therebetween.

FIG. 2 is a cross sectional view of a semiconductor device in the state that the semiconductor light emitting device 30 is bonded to the sub-mount substrate 1. The upper surfaces of the ohmic electrodes 36 and 37 contact the upper surface of the levee film 14 in ring areas surrounding the openings 15 and 16 formed through the levee film 14. Therefore, a closed space surrounded by the levee film 14 is defined between the ohmic electrode 36 and extension layer 4. Similarly, a closed space surrounded by the levee film 14 is defined between the ohmic electrode 37 and extension layer 5. A lead wire 40 is connected to the exposed surface of the p-side extension layer 4, and a lead wire 41 is connected to the exposed surface of the n-side extension layer 5.

The p-side barrier layer 8, connection member 10 and pad electrode 38 electrically connect the extension layer 4 on the sub-mount substrate 1 side to the ohmic electrode 36 of the semiconductor light emitting device 30 side. The n-side barrier layer 9, connection member 11 and pad electrode 39 electrically connect the extension layer 5 of the sub-mount substrate 1 side to the ohmic electrode 37 of the semiconductor light emitting device 30 side.

An air gap is defined between the inner circumferential surface of the opening 15 and the outer circumferential surface of the pad electrode 38. Since the height of the pad electrode 38 is slightly higher than the depth of the opening (thickness of the levee film 14), the surface layer of the pad electrode 38 on the upper surface side is buried in the connection member 10 and melted metal enters the air gap. In this embodiment, the volume of the pad electrode 38 is smaller than the volumetric capacity of the opening 15. Therefore, even if melted metal enters the air gap, it will not be filled completely in the air gap and some air gap is left. It is therefore possible to prevent the melted metal from leaking out of the opening 15.

In order to prevent leakage of the melted metal, the volume of the pad electrode 38 is preferably set to 97% or smaller than the volumetric capacity of the opening 15, and more preferably set to 95% or smaller. If the pad electrode 38 is made too small, a sufficient adhesion strength cannot be obtained. The volume of the pad electrode 38 is preferably set to 70% or larger than the volumetric capacity of the opening 15, and more preferably set to 85% or larger. Namely, the ratio of the volumetric capacity of the air gap left in the opening 15 to the volumetric capacity of the opening 15 is preferably 3% to 30% and more preferably 5% to 15%.

The relation between the n-side pad electrode 39 and opening 16 is similar to the relation between the p-side pad electrode 38 and opening 15. A short circuit defect between the p-side electrode and n-side electrode can be prevented.

The distance between the sub-mount substrate 1 and semiconductor light emitting device 30 after mounting is defined by the thickness of the levee film 14. Namely, the depth of the pad electrodes 38 and 39 buried in the connection members 10 and 11 can be adjusted easily. It is therefore possible to prevent the pad electrode from being buried in the connection member more than necessary and the melted metal from extending along the substrate surface.

When Au and Sn are made eutectic, the relative positions of the sub-mount substrate 1 and semiconductor light emitting device 30 become unstable in the state that the connection members 10 and 11 are melted. In the first embodiment, since the pad electrodes 38 and 39 of the semiconductor light emitting device 30 are inserted into the openings 15 and 16 of the sub-mount substrate 1, the relative positions of the sub-mount substrate 1 and semiconductor light emitting device 30 can be restricted even in the state that the connection members 10 and 11 are melted. It is therefore possible to prevent the manufacture yield from being lowered by position misalignment. In order to obtain sufficient position misalignment preventing effects, it is preferable to set the thickness of the levee film 14 to 500 nm or thicker. The thickness of the levee film 14 is preferably set to 3000 nm or thinner or more preferably set to 1000 nm or thinner, from the viewpoint of a process time, a side etching depth and the like of the silicon oxide etching process.

The AuSn eutectic material made of the uppermost Au layer of the pad electrode 38 and the connection member 10 is disposed in the closed space defined by the levee film 14. It is therefore possible to prevent moisture from invading into the space disposed with the AuSn eutectic material. It is generally known that Sn is likely to be subjected to electrochemical migration under the conditions of existence of moisture. Sn migration can be suppressed and the reliability of semiconductor devices can be improved.

In the first embodiment, the multi-layer structure of Au and Sn having each layer thickness of 50 nm to 200 nm was heated to form the AuSn eutectic material. A more stable eutectic process was able to be obtained, as compared to a general AuSn eutectic alloy method. For example, if AuSn alloy having an Sn content of 20 wt % is used as vapor deposition source, the vapor deposition amounts of Au and Sn change with time. Therefore, the composition of a deposited film is deviated from a target composition. As the composition is deviated, the eutectic temperature changes so that the eutectic reaction may become unstable. By using the multi-layer structure, the composition of the connection member can be set near to the target value and the eutectic reaction can be stabilized.

Next, description will be made on the lamination structure of the connection member 10, 11 and the thickness of the uppermost Au layer of the corresponding pad electrode 38, 39. Consider now the case that a eutectic ratio of AuSn eutectic alloy is Au:Sn=80:20 by a weight ratio. In this case, the volume ratio between Au and Sn is 0.544:0.456. Since it was confirmed that the Sn film formed by sputtering was grey tin, the density of 5.76 g/cm$^3$ was used. In the following generalized explanation, the volume ratios of Au and Sn to the entirety of eutectic metal are represented by Vau and Vsn.

By representing the number of Sn layers constituting the connection member 10 by n, the number of Au layers is n+1. Since the uppermost Au layer of the pad electrode 38 also participates the eutectic reaction, the number of Au layers participating the eutectic reaction is n+2.

The total thickness of the uppermost Au layer of the pad electrode 38 and the connection member 10 is represented by Lt. A thickness Lau of each Au layer and a thickness Lsn of each Sn layer are given by:

$$Lau = Lt \times Vau/(n+2)$$

$$Lsn = Lt \times Vsn/n$$

Assuming that the total thickness Lt is 1200 nm, the number n of Sn layers is 5, Vau=0.544 and Vsn=0.456, $$Lau = 93.3 \text{ nm}$$

$$Lsn = 109.4 \text{ nm}$$

The above-described first embodiment will be studied assuming that a thickness of the levee film 14 is 1000 nm, the thicknesses of Ni/Au/Pt/Au constituting the pad electrode 38 are 3 nm/100 nm /100 nm/1000 nm. In this case, the surface layer having a thickness of about 200 nm of the pad electrode 38 is buried in the connection member 14. It can be considered that the surface layer of 200 nm in thickness participates the eutectic reaction. If the total thickness Lt of eutectic metal is 1200 nm, the total thickness of the Au layers is 1200×Vau [nm]. Since the portion of 200 nm is supplied to the pad electrode 38, the total thickness of Au layers constituting the connection member 10 is (1200× Vau−200) [nm]. Since the number of Au layers is 6, the thickness of each Au layer is 75.5 nm, and a thickness of each Sn layer is 109.4 nm the same as the above-calculation result.

As described above, the volume ratio of Sn layers constituting the connection member 10 is set larger than the volume ratio calculated from a eutectic ratio. Therefore, when the connection member 10 is melted, Au is insufficient more than Sn. In order to supplement the insufficient Au, the uppermost Au layer of the pad electrode 38 is melted to progress the eutectic reaction. In this manner, the adhesion between the pad electrode 38 and connection member 10 can be reinforced.

Also in the first embodiment, the adhesion layer 6 is disposed between the extension layer 4 and levee film 14, and the adhesion layer 7 is disposed between the extension layer 5 and levee film 14. The upper surface of the connection member 10 (surface facing the semiconductor light emitting device 30) is broader than the upper surface of the pad electrode 38 (surface facing the sub-mount substrate 1). The levee film 14 is made in tight adhesion to the partial upper surface of the connection member 10 via the adhesion layer 12. The relation between the levee film 14 and connection member 39 is similar: the levee film 14 in tight adhesion to the partial upper surface of the connection member 11 via the adhesion layer 13. The adhesion layer 12 has the function of improving tight adhesion of the levee film 14. In the embodiment, although Ti is used as the material of the adhesion layer, Ni or Al may also be used.

As current is injected into the active layer 34, radiation occurs. The sapphire substrate 31 transmits this radiation. Light is irradiated to an external via the sapphire substrate 31. Light propagating toward the sub-mount substrate 1 is reflected by the p-side ohmic electrode 36 and irradiated to the external via the sapphire substrate 31.

In the above-described first embodiment, although a conductive silicon substrate is used as the underlying substrate of the sub-mount substrate 1, an insulating substrate made of aluminum nitride (AlN), alumina ($Al_2O_3$) or the like may be used. In this case, without forming the insulating film 3 shown in FIG. 1, the extension layers 4 and 5 may be directly formed on the underlying substrate. The material of the underlying substrate is preferably material having a high thermal conductivity and a thermal expansion coefficient near that of the semiconductor light emitting device. An example of such conductive material is CuW or the like in addition to silicon.

In the first embodiment, although silicon oxide is used as the material of the levee film 14, other insulating materials may be used. For example, heat resistant oxide insulating material such as alumina ($Al_2O_3$), titanium oxide ($TiO_2$, $Ti_2O_5$), zirconia ($ZrO_2$) and hafnia ($HfO_2$) and heat resistant polymer material such as polyimide resin may be used.

Figure 3:
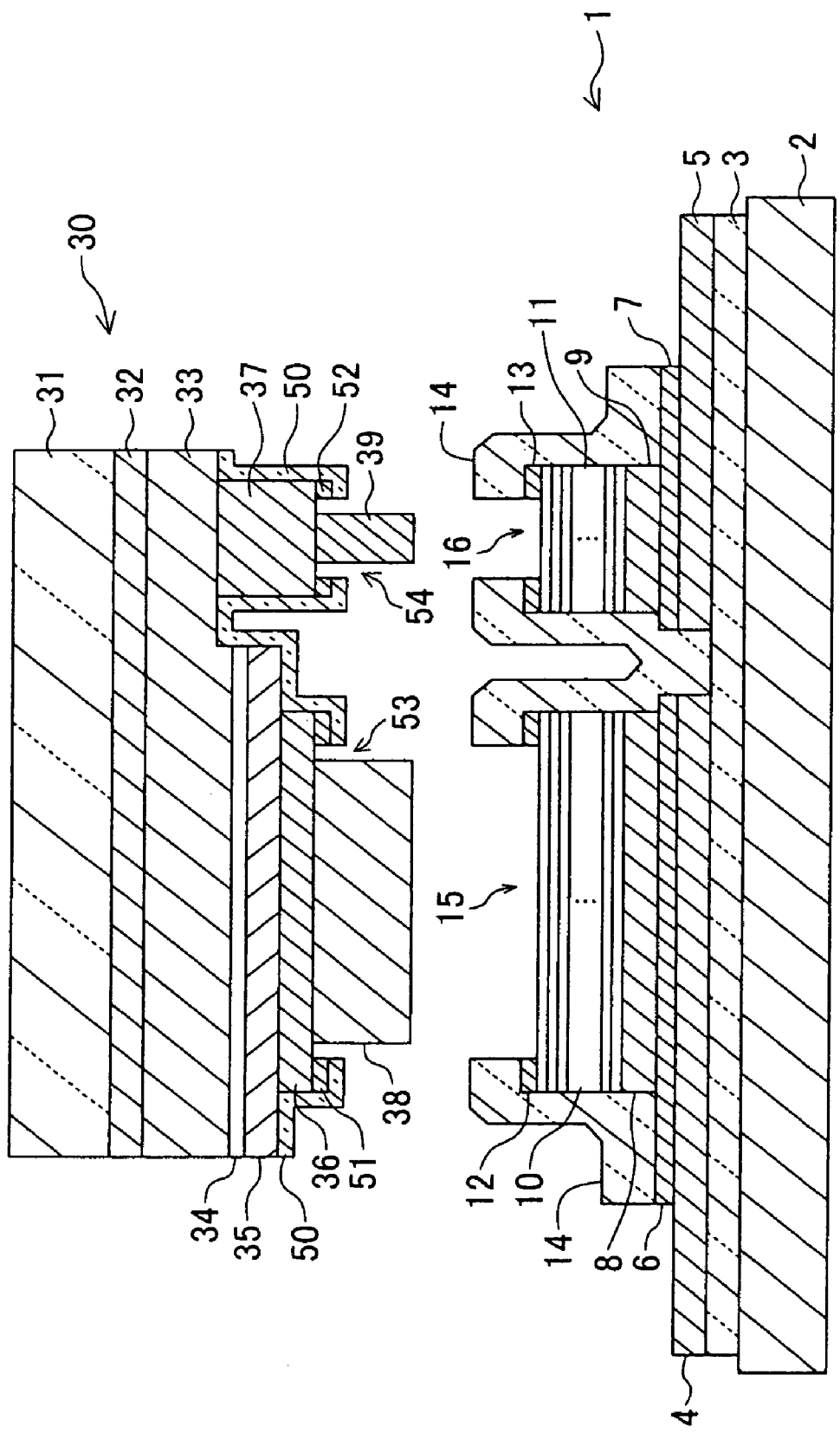
FIG. 3 is a cross sectional view showing the state of a semiconductor device before mounting according to a second embodiment.
Figure 4:
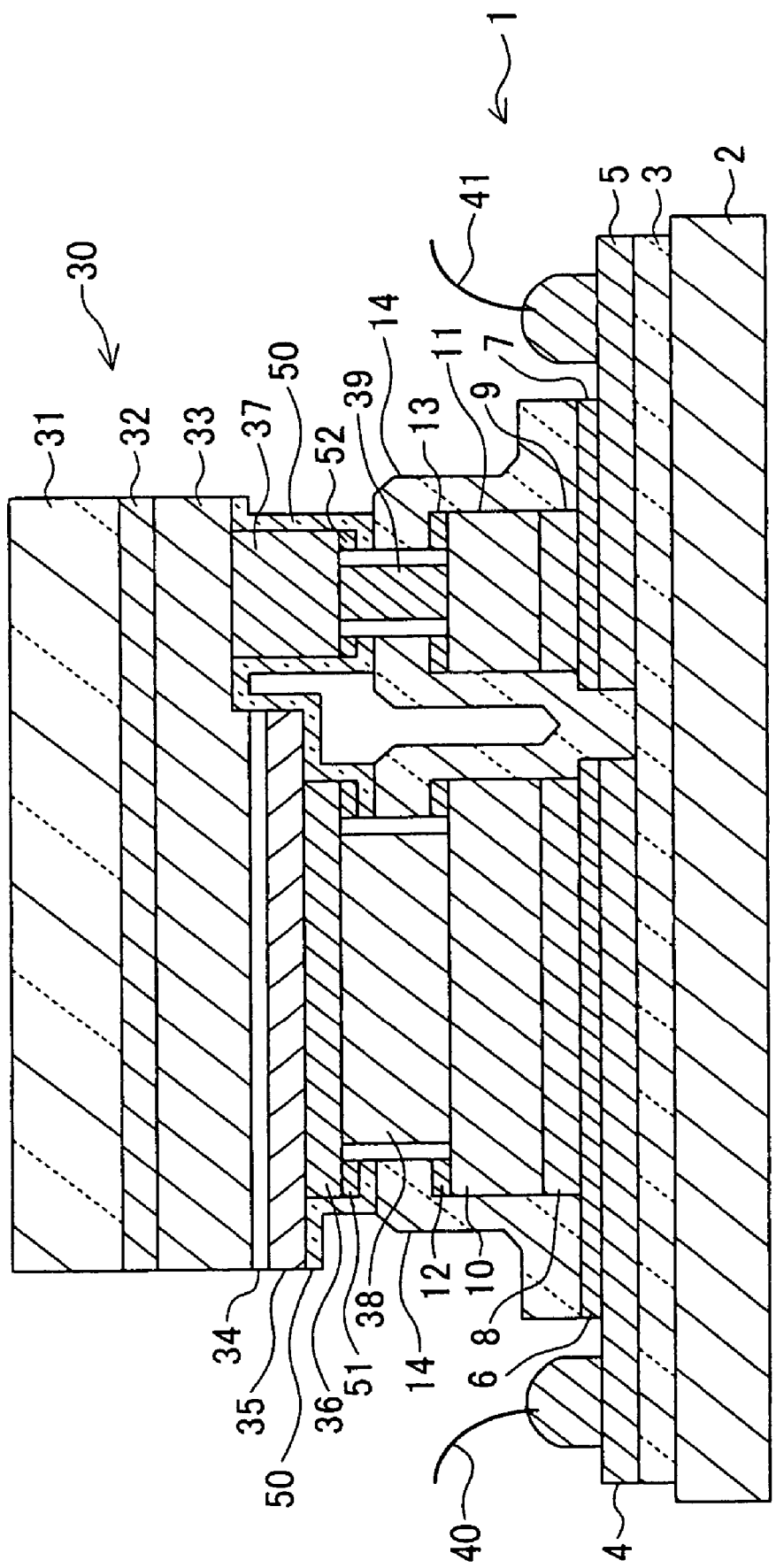
FIG. 4 is a cross sectional view showing the semiconductor device after mounting according to the second embodiment.

Next, with reference to FIGS. 3 and 4, the second embodiment will be described. FIG. 3 shows the state before flip-chip bonding, and FIG. 4 shows the state after flip-chip bonding. The main different point of the semiconductor device of the second embodiment from the semiconductor device of the first embodiment resides in that the surface of a semiconductor light emitting device 30 facing a sub-mount substrate 1 is covered with a protective film 50. This protective film is not formed in the first embodiment. Different points from the first embodiment will be described hereinunder.

As shown in FIG. 3, the surface of the semiconductor light emitting device 30 facing the sub-mount substrate 1 is covered with the protective film 50 made of silicon oxide. Openings 53 and 54 are formed through the protective film in the areas corresponding to openings 15 and 16 of the sub-mount substrate 1. The upper surfaces of ohmic electrodes 36 and 37 are exposed on the bottoms of the openings 53 and 54. A pad electrode 38 is formed on the surface of the ohmic electrode 36 exposed on the bottom of the opening 53. A pad electrode 39 is formed on the surface of the ohmic electrode 37 exposed on the bottom of the opening 54.

An adhesion layer 51 is disposed between the upper surface of the p-side ohmic electrode 36 and the protective film 50, and an adhesion layer 52 is disposed between the upper surface of the n-side ohmic electrode 37 and the protective film 50. The adhesion layers 51 and 52 are made of Ti, Ni, Al or the like.

Description will be made hereinunder on a manufacture method for the semiconductor light emitting device 30, paying attention to different points from the semiconductor light emitting device 30 of the first embodiment.

When the p-side ohmic electrode 36 is formed, not only two layers, a Pt layer and an Rh layer, are formed, but also a Ti layer having a thickness of 10 nm is formed on the Rh layer by electron beam vapor deposition. The ohmic electrode 36 is formed by lift-off. At this time, the Ti layer as the adhesion layer 51 is left on the upper surface of the ohmic electrode 36. When the n-side ohmic electrode 37 is formed, not only five layers, AlRh/Au/Pt/Au, are formed, but also a Ti layer having a thickness of 10 nm is formed by electron beam vapor deposition. The ohmic electrode is formed by lift-off. At this time, the Ti layer as the adhesion layer 52 is left on the upper surface of the ohmic electrode 37.

The protective film 50 made of silicon oxide and having a thickness of 300 nm is formed by sputtering, covering the whole surface of the semiconductor light emitting device. A partial area of the protective film 50 is covered with a resist pattern to etch the protective film 50 and form the openings 53 and 54. At this time, the Ti layers exposed on the bottoms of the openings 53 and 54 are also etched to expose the upper surfaces of the ohmic electrodes 36 and 37.

The pad electrodes 38 and 39 are formed by electron beam vacuum deposition and lift-off. The pad electrodes 38 and 39 have a four-layer structure of an Ni layer having a thickness of 3 nm, an Au layer having a thickness of 100 nm, a Pt layer having a thickness of 100 nm and an Au layer having a thickness of 200 nm to 2000 nm stacked in this order. A thickness of the uppermost Au layer is determined by considering the depths of the openings 15 and 16 on the sub-mount substrate 1 side (thickness of the levee film 14), a flatness degree of the surfaces of the pad electrodes 38 and 39, a proper pushing margin and the like. For example, if the thickness of the levee film 14 is 1 μm, the thickness of the protective film 50 is 300 nm, the sway on the surfaces of the pad electrodes 38 and 39 is 20 nm and the pushing margin is 200 nm, then the proper thicknesses of the uppermost Au layers of the pad electrodes 38 and 39 are 1300 nm. Namely, the thickness is increased by the thickness of the protective film 50 more than the thicknesses of the pad electrodes 38 and 39 of the first embodiment.

As shown in FIG. 4, in the state that the semiconductor light emitting device 30 is mounted on the sub-mount substrate 1, the upper surface of the protective film 50 contacts the upper surface of the levee film 14 in the peripheral area of the openings 15 and 16 (in the ring areas surrounding the openings 15 and 16). Closed spaces surrounded by the levee film 14 and protective film 50 are defined between the p-side ohmic electrode 36 and extension layer 4 and between the n-side ohmic electrode 37 and extension layer 5.

The volumetric capacity of the opening 15 formed on the sub-mount substrate 1 side is set larger than the volume of a portion of the pad electrode 38 protruding from the upper surface of the protective film 50 so that melted metal can be prevented from flowing to an external of the opening 15. Similarly, the volumetric capacity of the opening 16 is set larger than the volume of a portion of the pad electrode 39 protruding from the upper surface of the protective film 50 so that melted metal can be prevented from flowing to an external of the opening 16.

In the second embodiment, since the openings 53 and 54 are formed also on the semiconductor light emitting device 30 side, the volumes of the pad electrodes 38 and 39 may be set by considering these openings. For example, the volume of the pad electrode 38 is set smaller than the sum of the volumetric capacities of the openings 15 and 53. Similar to the first embodiment, the volume of the pad electrode 38 is preferably set to 97% or smaller than the sum of volumetric capacities of the openings 15 and 53, or more preferably to 95% or smaller. The volume of the pad electrode 38 is preferably set to 70% or larger than the sum of volumetric capacities of the openings 15 and 53, or more preferably to 85% or larger.

In the first embodiment, as shown in FIG. 2, partial areas of the ohmic electrodes 36 and 37 are exposed. In contrast, in the second embodiment, as shown in FIG. 4, the ohmic electrodes 36 and 37 are completely covered with the protective film 50. Since the metal member used for the connection between the sub-mount substrate 1 and semiconductor light emitting device 30 is not exposed, weatherproof can be improved.

Figure 5:
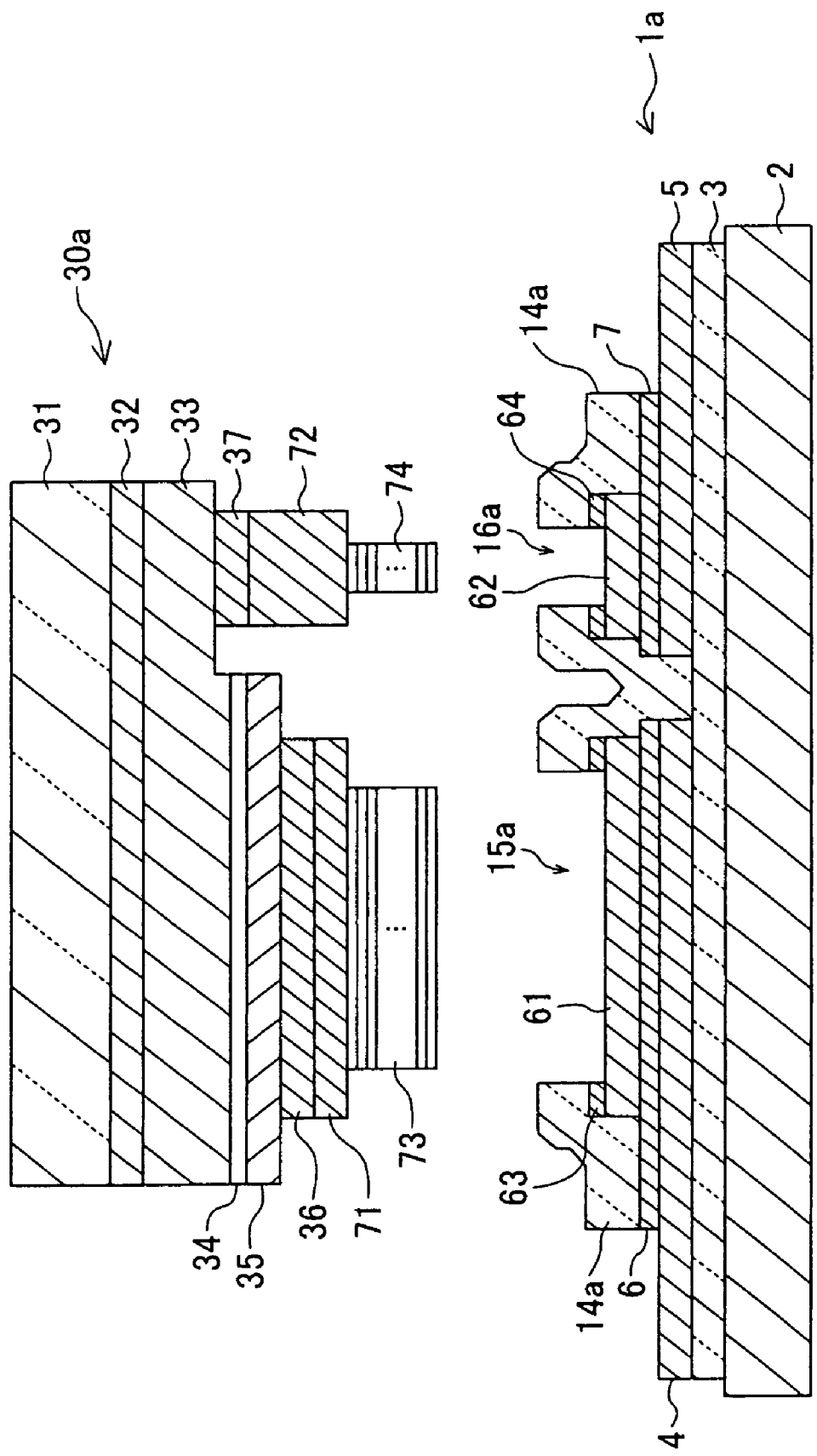
FIG. 5 is a cross sectional view showing the state of a semiconductor device before mounting according to a third embodiment.

With reference to FIG. 5, a semiconductor device according to the third embodiment will be described. FIG. 5 is a cross sectional view showing the state before a semiconductor light emitting device 30a is mounted on a sub-mount substrate 1a.

Description will be made on the structure of the sub-mount substrate 1a and its manufacture method. Similar to the first embodiment, an insulating film 3, extension layers 4 and 5 and adhesion layers 6 and 7 are formed on the principal surface of a silicon substrate 2.

A p-side pad electrode (connection member on the sub-mount substrate side) 61 is formed on a partial surface of the adhesion layer 6, and an adhesion layer 63 is formed on the p-side pad electrode 61. An n-side pad electrode 62 is formed on a partial surface of the adhesion layer 5, and an adhesion layer 64 is formed on the n-side pad electrode 62. The pad electrodes 61 and 62 have a four-layer structure of a Ti layer having a thickness of 10 nm, an Au layer having a thickness of 100 nm, a Pt layer having a thickness of 100 nm and an Au layer having a thickness of 600 nm stacked in this order. The adhesion layers 63 and 64 are made of a Ti layer having a thickness of 10 nm. These layers are formed by electron beam vacuum deposition and lift-off after the extension layers 4 and 5 and the adhesion layers 6 and 7 are formed. In this embodiment, a thickness of the uppermost Au layers of the pad electrodes 61 and 62 may be set to 100 nm to 1000 nm.

A silicon oxide film having a thickness of 1000 nm is deposited on the whole surface and patterned to form a levee film 14a. During this patterning, the exposed portions of the adhesion layers 6, 7, 63 and 64 are etched. Openings 15a and 16a are formed through the levee film 15a, exposing the upper surfaces of the pad electrodes 61 and 62 and partial surfaces of the extension layers 4 and 5.

Next, description will be made on the structure of the semiconductor light emitting device 30a and its manufacture method. Similar to the first embodiment shown in FIG. 1, an initial nucleus forming layer 32, an n-type semiconductor layer 33, an active layer 34, a p-type semiconductor layer 35, a p-side ohmic electrode 36 and an n-side ohmic electrode 37 are stacked on a principal surface of a sapphire substrate 31. The n-side ohmic electrode 37 is thinner than the n-side ohmic electrode 37 of the first embodiment and has a two-layer structure of an Al layer having a thickness of 3 nm and an Rh layer having a thickness of 100 nm.

A barrier layer 71 is formed on the surface of the p-side ohmic electrode 36, and a barrier layer 72 is formed on the surface of the n-side ohmic electrode 37. The barrier layer 71 has a three-layer structure of an Au layer having a thickness of 100 nm, a Pt layer having a thickness of 100 nm and an Au layer having a thickness of 100 nm stacked in this order. The barrier layer 72 has a three-layer structure of an Au layer having a thickness of 100 nm, a Pt layer having a thickness of 100 nm and an Au layer having a thickness of 800 nm stacked in this order. A thickness of the uppermost Au layer is selected in the range from 100 nm to 2000 nm in accordance with the necessary conditions. The whole of the n-side ohmic electrode 37 and barrier layer 72 has a five-layer structure of Al/Rh/Au/Pt/Au which is the same lamination structure as that of the n-side ohmic electrode 37 of the first embodiment shown in FIG. 1. In the third embodiment, two layers Al/Rh on the substrate side are called the ohmic electrode, and the upper three layers Au/Pt/Au are called the barrier layer.

A p-side connection member 73 is formed on a partial surface of the barrier layer 71, and an n-side connection member 74 is formed on a partial surface of the barrier layer 72. The connection members 73 and 74 have a multi-layer structure of a Ni layer having a thickness of 20 nm and Al and Sn layers alternately stacked on the Ni layer. In the third embodiment, a thickness of the Au layer was set to 80.3 nm and a thickness of the Sn layer was set to 106.3 nm. Seven Au layers and six Sn layers were disposed and the Au layer is used for both the lowermost and uppermost layers.

As viewed along the line of sight perpendicular to the principal surface of the sub-mount substrate 1a in the state that the sub-mount substrate 1a and semiconductor light emitting device 30a are disposed facing each other, the connection member 73 is positioned inside the opening 15a and the connection member 74 is positioned inside the opening 16a. The barrier layer 71 extends outside of the outer periphery of the opening 15a, and the barrier layer 72 extends outside of the outer periphery of the opening 16a.

Next, a manufacture method for the semiconductor light emitting device 30a will be described. The processes up to a process of etching partial regions of the active layer 34 and p-type semiconductor layer 35 to expose a partial area of the n-type semiconductor layer 33 are similar to those of the first embodiment.

The ohmic electrode 36 and barrier layer 71 are formed on the surface of the p-type semiconductor layer 35 by electron beam vacuum deposition and lift-off. Thereafter, the ohmic electrode 37 and barrier layer 72 are formed on the exposed surface of the n-type semiconductor layer 33 by electron beam vacuum deposition and lift-off. Next, the connection members 73 and 74 are formed on the barrier layers 71 and 72 by electron beam vacuum deposition and lift-off.

The connection members 73 and 74 are inserted into the openings 15a and 16a to make eutectic the connection members 73 and 74 and the uppermost Au layers of the pad electrodes 61 and 62. Partial upper surfaces of the barrier layers 71 and 72 contact the upper surface of the levee film 14a in the peripheral areas of the openings 15a and 16a. Closed spaces surrounded by the levee film 14a are therefore defined between the barrier layer 71 and extension layer 4 and between the barrier layer 72 and extension layer 5. The connections member 73 and pad electrode 61 and the connection member 74 and pad electrode 62 are disposed in these closed spaces. Similar to the first embodiment, it is therefore possible to prevent melted metal from flowing to an external via the openings 15a and 16a.

Figure 6:
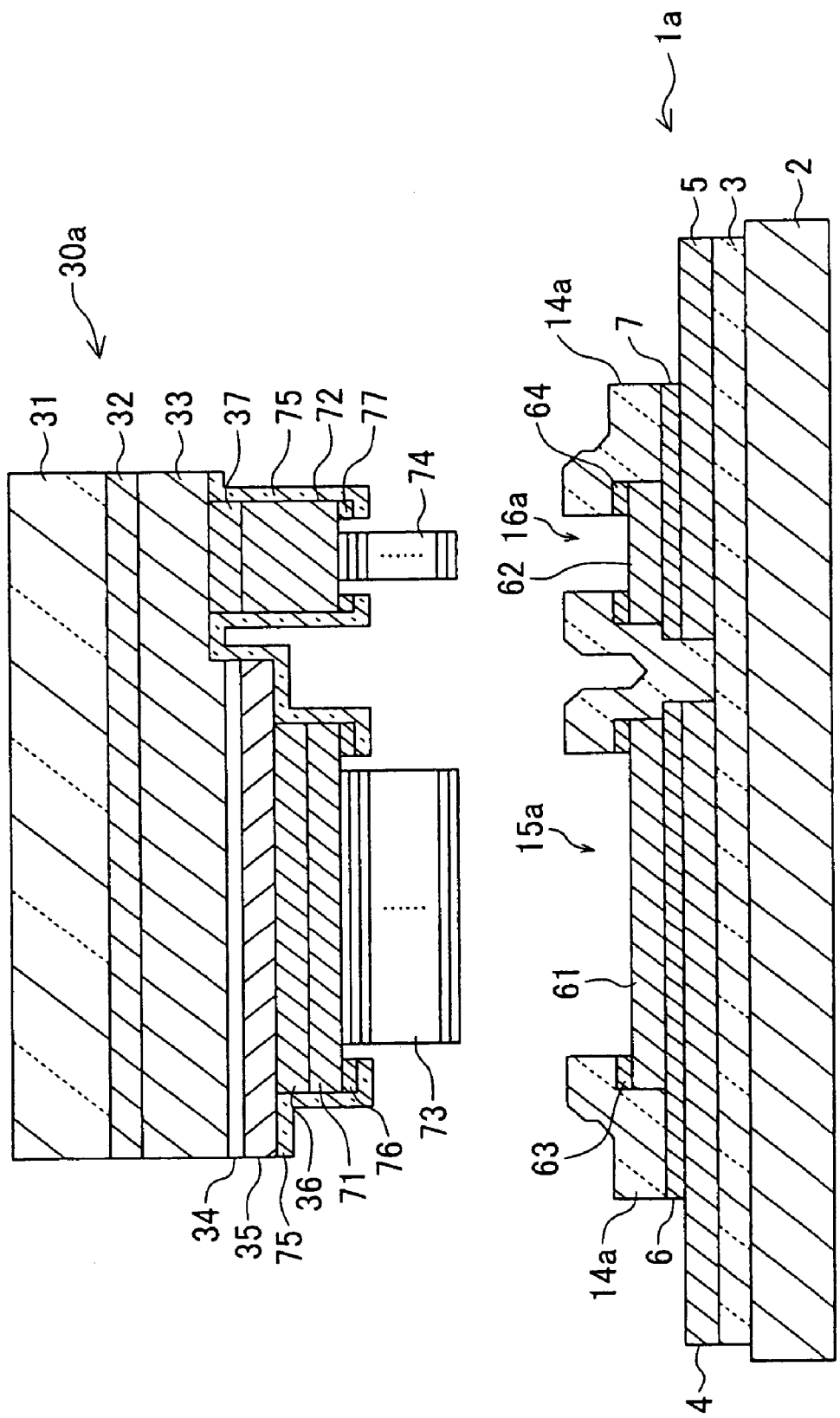
FIG. 6 is a cross sectional view showing the state of a semiconductor device before mounting according a modification of the third embodiment.

As shown in FIG. 6, similar to the second embodiment shown in FIG. 3, the surface of the semiconductor light emitting device 30a facing the sub-mount substrate 1a may be covered with a protective film 75 of silicon oxide. An adhesion layer 76 is disposed between the protective film 75 and the upper surface of the barrier layer 71, and an adhesion layer 77 is disposed between the protective film 75 and the upper surface of the barrier layer 72. In the state that the semiconductor light emitting device 30a is mounted on the sub-mount substrate 1a, the upper surface of the protective film 75 contacts the upper surface of the levee film 14a in the peripheral areas of the openings 15a and 16a. The connection members 73 and 74 are made thicker by the total thickness of the adhesion layer 76 and protective film 75 than the thickness of the connections members 73 and 74 shown in FIG. 5.

Figure 7:
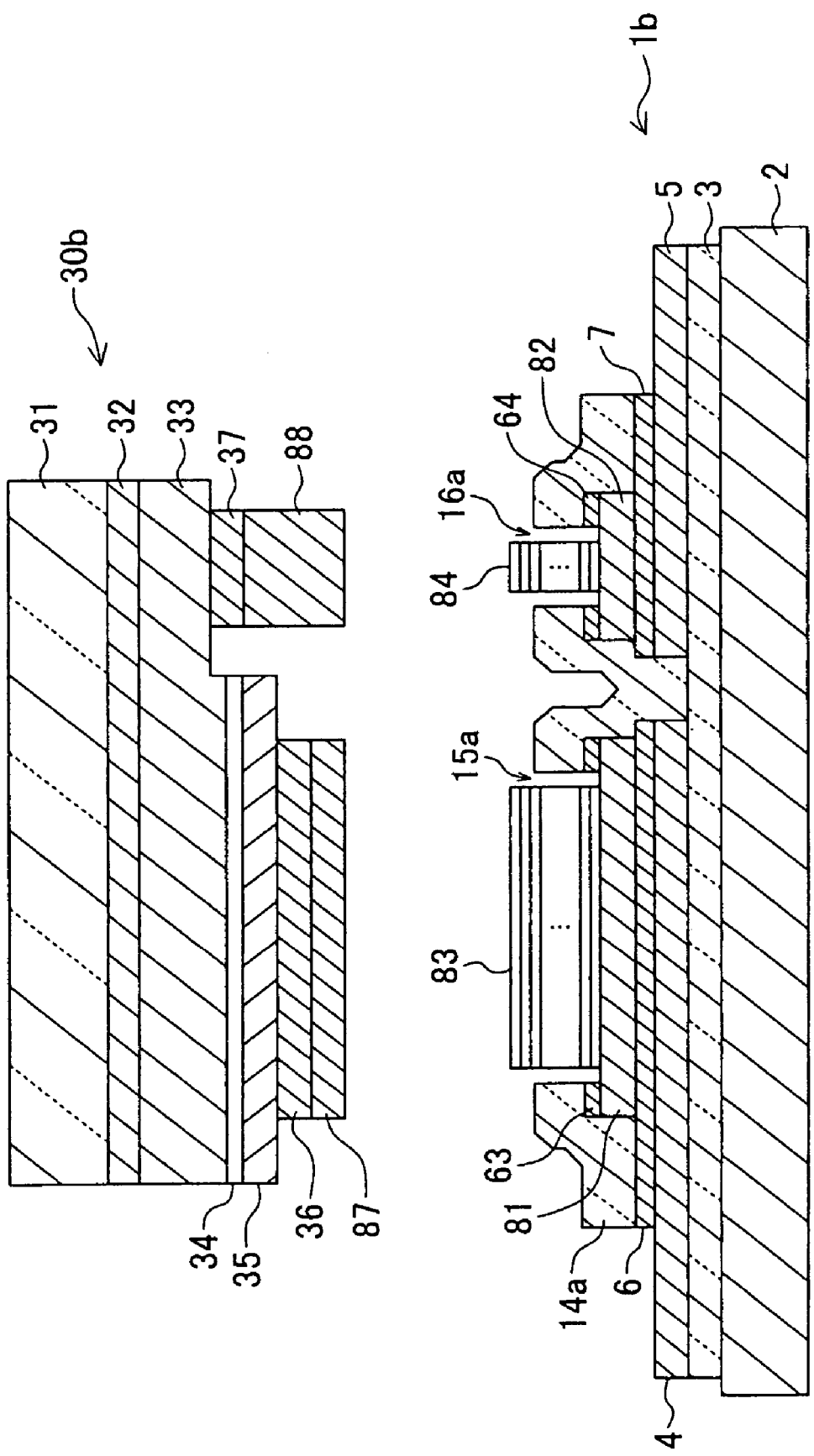
FIG. 7 is a cross sectional view showing the state of a semiconductor device before mounting according to a fourth embodiment.

With reference to FIG. 7, a semiconductor device of the fourth embodiment will be described. In the following, the semiconductor device will be described by comparing it with the semiconductor device of the third embodiment shown in FIG. 5.

In a sub-mount substrate 1b of the fourth embodiment, barrier layers 81 and 82 are disposed in place of the pad electrodes 61 and 62 of the third embodiment. The structures of the barrier layers 81 and 82 are similar to the structures of the pad electrodes 61 and 62. A connection member 83 is formed on the barrier layer 81 exposed on the bottom of an opening 15a, and a connection member 84 is formed on the barrier layer 82 exposed on the bottom of an opening 16a. The other structures are similar to those of the sub-mount substrate 1a of the third embodiment. An air gap is defined between the connection member 83 and the inner circumferential surface of the opening 15a, and an air gap is also defined between the connection member 84 and the inner circumferential surface of the opening 16a. The upper regions of the connection members 83 and 84 are slightly protruded above the upper surface of a levee film 14a. The volume of the connection member 83 is smaller than the volumetric capacity of the opening 15a, and the volume of the connection member 84 is smaller than the volumetric capacity of the opening 16a.

The connection members 83 and 84 are formed by electron beam vacuum deposition and lift-off after the levee film 14a having the openings 15a and 16a is formed.

In a semiconductor light emitting device 30b of the fourth embodiment, pad electrodes 87 and 88 are disposed in place of the barrier layers 71 and 72 of the third embodiment. The structures of the pad electrodes 87 and 88 are the same as those of the barrier layers 71 and 72. In the fourth embodiment, since the connection members 83 and 84 are disposed on the sub-mount substrate 1b, members corresponding to the connection members 73 and 74 of the third embodiment are not disposed in the semiconductor light emitting device 30b.

In the state that the semiconductor light emitting device 30b is mounted on the sub-mount substrate 1b, the upper surfaces of the pad electrodes 87 and 88 contact the upper surface of the levee film 14a in the peripheral areas of the openings 15a and 16a. The connection members 83 and 84 and the uppermost Au layers of the pad electrodes 87 and 88 are made eutectic. Melted metal enters in the air gaps in the openings 15a and 16a and will not flow outside of the openings 15a and 16a.

Similar to the first embodiment, the volume of the connection member 83 is preferably set to 97% or smaller than the volumetric capacity of the opening 15a, or more preferably to 95% or smaller. The volume of the connection member 83 is preferably set to 70% or larger than the volumetric capacity of the opening 15a, or more preferably to 85% or larger.

Figure 8:
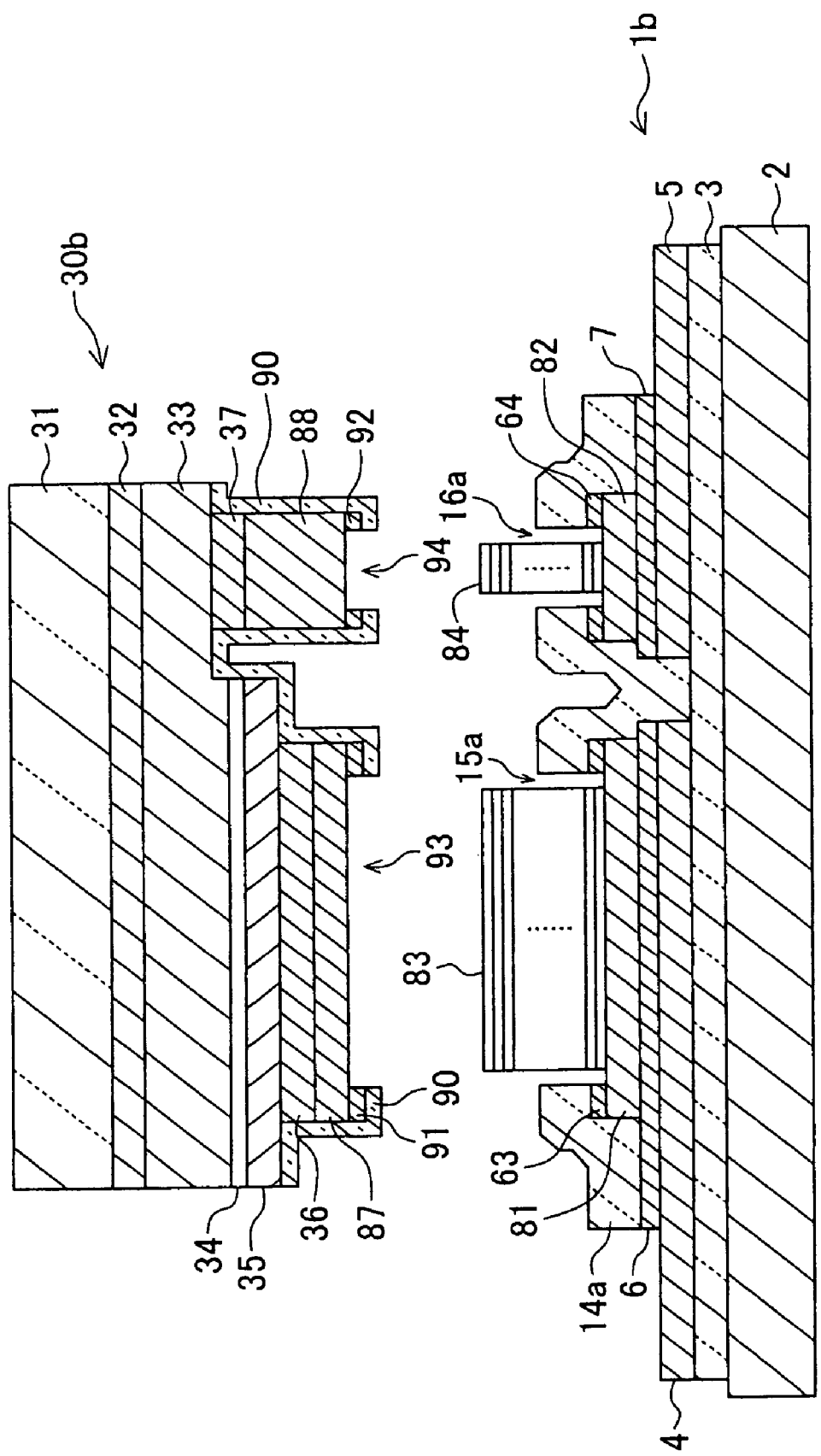
FIG. 8 is a cross sectional view showing the state of a semiconductor device before mounting according a modification of the fourth embodiment.

As shown in FIG. 8, the surface of the semiconductor light emitting device 30b facing the sub-mount substrate 1b may be covered with a protective film 90 of silicon oxide. An adhesion layer 91 is disposed between the protective film 90 and the upper surface of the pad electrode 87, and an adhesion layer 92 is disposed between the protective film 90 and the upper surface of the pad electrode 88. Openings 93 and 94 are formed through the protective film 90 and adhesion layers 91 and 92 in the areas corresponding to the openings 15a and 16a of the sub-mount substrate 1b, partially exposing the pad electrodes 87 and 88.

The connection members 83 and 84 of the sub-mount substrate 1b are made thicker by a total thickness of the protective film 90 and adhesion layer 91 than the thickness of the connection members 83 and 84 shown in FIG. 7. The connections members 83 and 84 are made in tight adhesion to the pad electrodes 87 and 88 exposed on the bottoms of the openings 93 and 94 to make these eutectic.

Figure 9A:
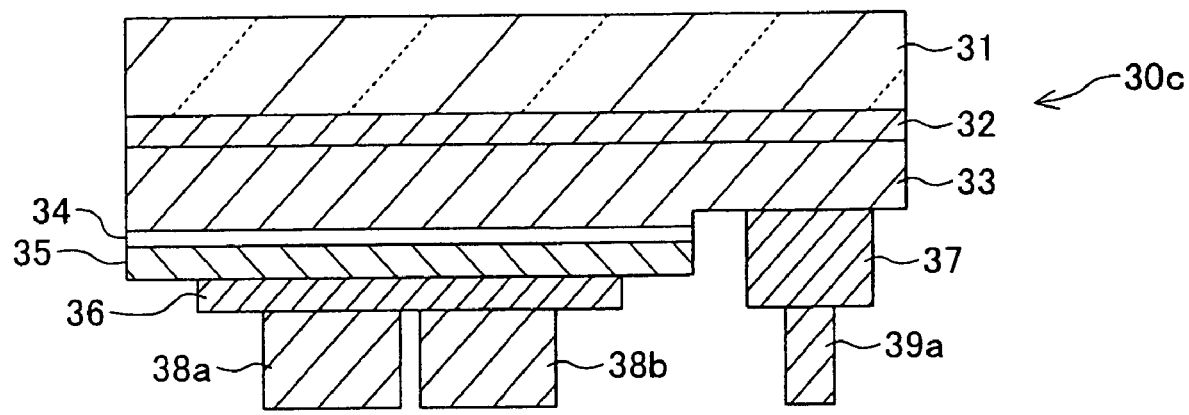
FIG. 9A is a cross sectional view of a semiconductor light emitting device according to a fifth embodiment.
Figure 9B:
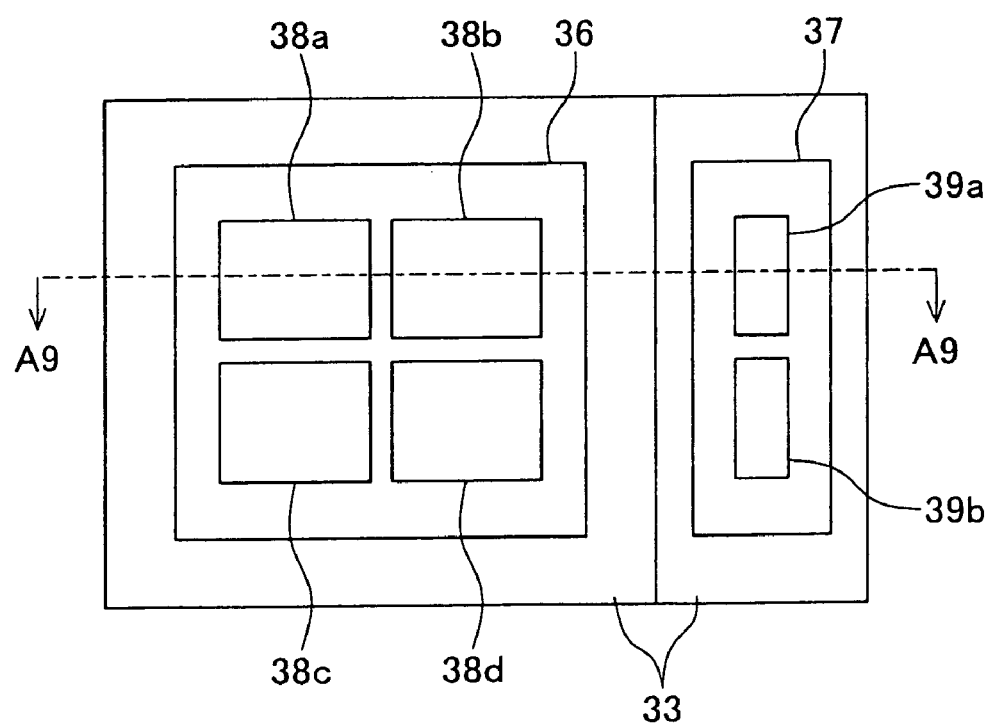
FIG. 9B is a bottom view of the semiconductor light emitting device according to the fifth embodiment.

With reference to FIGS. 9A and 9B, a semiconductor device of the fifth embodiment will be described. FIG. 9A is a cross sectional view of a semiconductor light emitting device 30c, and FIG. 9B is a bottom view thereof. A cross sectional view taken along one-dot chain line A9—A9 shown in FIG. 9B corresponds to FIG. 9A. Description will be made by comparing the semiconductor light emitting device 30c with the semiconductor light emitting device 30 of the first embodiment shown in FIG. 1.

In the first embodiment, the pad electrode 38 is a single integral member, whereas in the fifth embodiment, a pad electrode 38 is divided into four regions 38a to 38d, and a pad electrode 39 is divided into two regions 39a and 39b. The other structures are the same as those of the semiconductor light emitting device 30 of the first embodiment shown in FIG. 1.

Gaps are defined between adjacent regions 38a to 38d of the pad electrode 38. A gas is also defined between two regions 39a and 39b of the pad electrode 39.

If pad electrodes are large and when the pad electrodes are pressed against the connection members 10 and 11 shown in FIG. 1 and partial regions of the connection members 10 and 11 and pad electrodes are melted in the eutectic bonding process, channeling of the melted metal may occur and the melted metal rides across the levee film 14 and flows outside of the openings 15 and 16 in some cases. If the pad electrode is divided into a plurality of regions to define gaps between adjacent regions as in the fifth embodiment, melted metal enters these gaps. It is therefore possible to prevent channeling of melted metal and realize stable bonding.

Division of a pad electrode is not limited only to the pad electrode of the semiconductor light emitting device of the first embodiment, but it may be applied to pad electrodes of other embodiments or the connection member may be divided. For example, if this division is applied to the third embodiment shown in FIG. 5, each of the connection members 73 and 74 disposed on the semiconductor light emitting device 30a is divided into a plurality of regions. If this division is applied to the fourth embodiment shown in FIG. 7, each of the connection members 83 and 84 disposed in the openings 15a and 16a is divided into a plurality of regions. It is not necessary to completely separate a pad electrode or connection member, but grooves may be formed on the upper surface layer of the pad electrode (upper surface layer facing the connection member) or on the upper surface layer of the connection member (upper surface layer facing the pad electrode). In the state that the semiconductor substrate is mounted on the sub-mount substrate, material (AuSn eutectic metal) of the connection member enters the grooves. The example shown in FIG. 9A can be considered a special case wherein the depth of the grooves is equal to the thickness of the pad electrode regions 38a to 38d and 39a and 39b.

Figure 10:
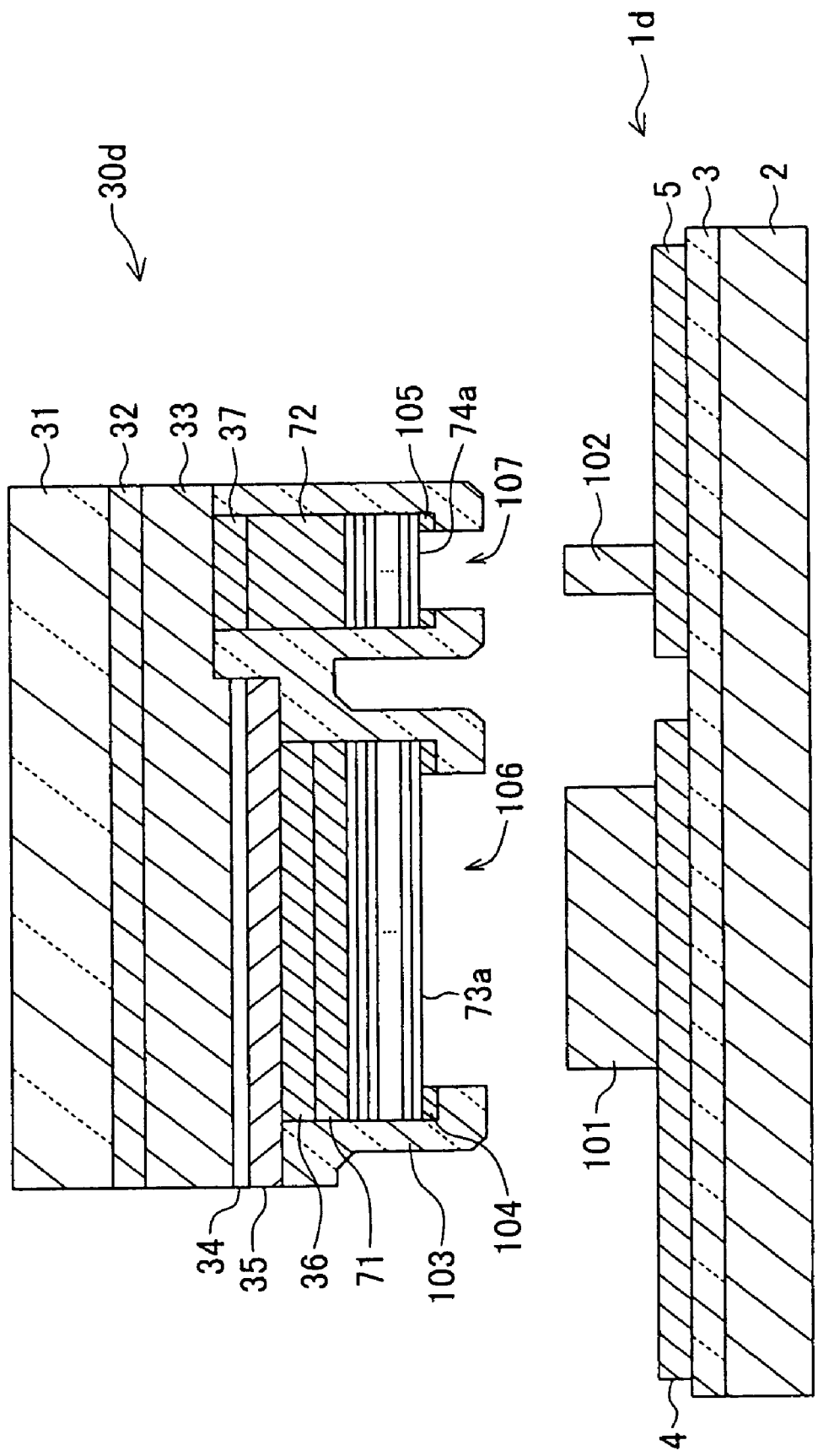
FIG. 10 is a cross sectional view showing the state of a semiconductor device before mounting according a sixth embodiment.

With reference to FIG. 10, a semiconductor device of the sixth embodiment will be described. In the first to fifth embodiments, the levee film is disposed on the sub-mount side, whereas in the sixth embodiment, it is disposed on the semiconductor light emitting device side.

The structure of a sub-mount substrate 1d will be described. A silicon substrate 1, an insulating film 3, and extension layers 4 and 5 are similar to those of the first embodiment shown in FIG. 1. A pad electrode 101 is formed on a partial surface of the p-side extension layer 4, and a pad electrode 102 is formed on a partial surface of the n-side extension layer 5. The pad electrodes 101 and 102 have a four-layer structure of Ni/Au/Pt/Au stacked in this order form the substrate side.

The structure of a semiconductor light emitting device 30d will be described. A sapphire substrate 31, an initial nucleus forming layer 32, an n-type semiconductor layer 33, an active layer 34, a p-type semiconductor layer 35, ohmic electrodes 36 and 37 and barrier layers 71 and 72 have structures similar to those of the semiconductor light emitting device 30a shown in FIG. 5. A connection member 73a is formed on the barrier layer 71, and a connection member 74a is formed on the barrier layer 72. An adhesion layer 104 is formed on the upper surface of the connection member 73a, and an adhesion layer 105 is formed on the upper surface of the connection member 74a. The lamination structure from the ohmic electrode 36 to the adhesion layer 104 is formed by processes utilizing electron beam vacuum deposition and lift-off. The lamination structure from the ohmic electrode 37 to the adhesion layer 105 is formed by other processes utilizing electron beam vacuum deposition and lift-off.

The surface of the semiconductor light emitting device 30d facing the sub-mount substrate 1d is covered with a levee film 103 made of silicon oxide. An opening 106 is formed through the levee film 103 and adhesion layer 104 to expose the connection member 73a on the bottom of the opening. An opening 107 is formed through the levee film 103 and adhesion layer 105 to expose the connection member 74a on the bottom of the opening.

As viewed along the line of sight parallel to the substrate normal in the state that the sub-mount substrate 1d and semiconductor light emitting device 30d are disposed facing each other, the pad electrode 101 is positioned inside the opening 106 and the pad electrode 102 is positioned inside the opening 107. The pad electrode 101 is inserted into the opening 106 to make it contact the connection member 73a, and the pad electrode 102 is inserted into the opening 107 to make it contact the connection member 74a. The uppermost Au layer of the pad electrode 101 and the connection member 73a, and the uppermost Au layer of the pad electrode 102 and the connection member 74a, are made eutectic to mount the semiconductor light emitting device 30d on the sub-mount substrate 1d.

The volume of the pad electrode 101 is made smaller than the volumetric capacity of the opening 106, and the volume of the pad electrode 102 is made smaller than the volumetric capacity of the opening 107, so that metal melted during the eutectic process can be prevented from leaking outside of the openings 106 and 107.

Figure 11:
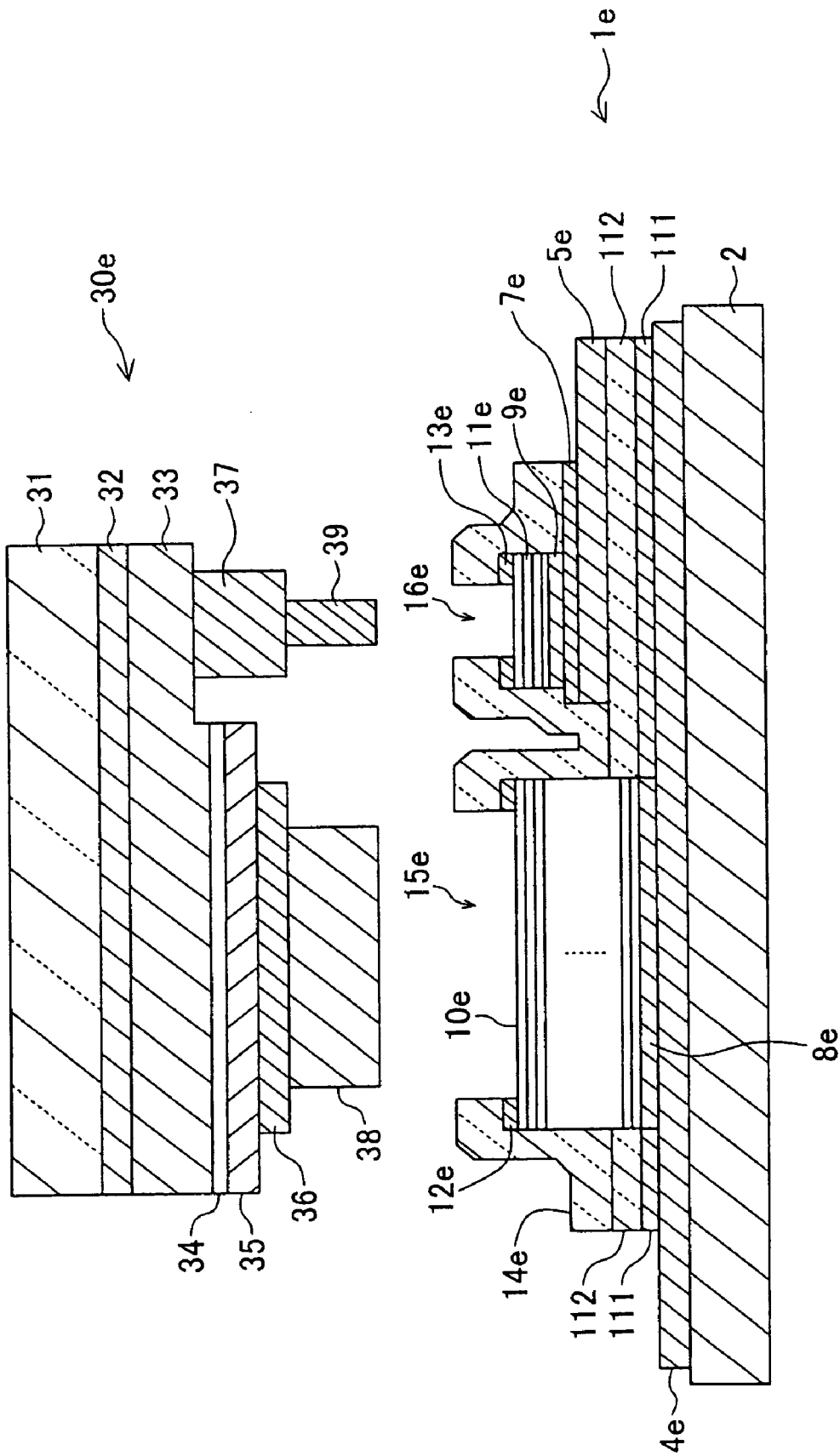
FIG. 11 is a cross sectional view showing the state of a semiconductor device before mounting according a seventh embodiment.
Figure 12:
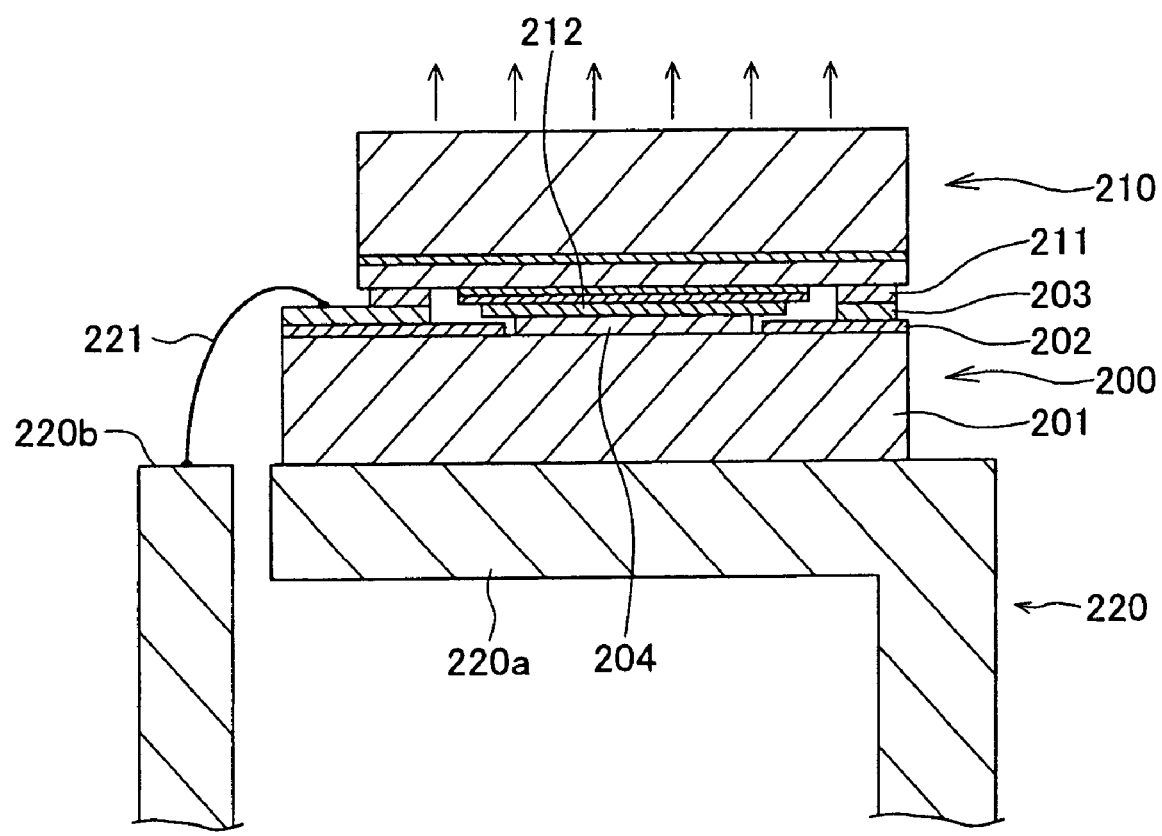
FIG. 12 is a cross sectional view of a conventional semiconductor light emitting device.

With reference to FIG. 11, a semiconductor device of the seventh embodiment will be described by comparing it with the semiconductor device of the first embodiment shown in FIG. 1. A semiconductor light emitting device 30e of the seventh embodiment has a structure similar to that of the semiconductor light emitting device 30 of the first embodiment.

In the first embodiment, the p-side extension layer 4 and n-side extension layer 5 are formed on the surface of the insulating film 3 on the silicon substrate 2, whereas in the seventh embodiment, a p-side extension layer 4e extends to the region where an n-side connection member is disposed. On a partial surface of the p-side extension layer 4e, a barrier layer 8e, a connection member 10e and an adhesion layer 12e are stacked in this order. The structures of these layers are similar to those of the barrier layer 8, connection member 10 and adhesion layer 12 of the first embodiment shown in FIG. 1.

On another partial surface of the p-side extension layer 4e, an adhesion layer 111 and an insulating film 112 are formed, and on this insulating film, an n-side extension layer 5e, an adhesion layer 7e, a barrier layer 9e, a connection member 11e and an adhesion layer 13e are stacked in this order. For example, the adhesion layer 111 is made of Ti and the insulating film 112 is made of silicon oxide. The lamination structure from the extension layer 5e to the adhesion layer 13e is similar to the lamination structure from the n-side extension layer 5 to the adhesion layer 13 of the first embodiment shown in FIG. 1. The height of the barrier layer or connection member is adjusted so that the upper surfaces of the connection members 10e and 13e are made flush.

A levee film 14e is formed on the surface of a sub-mount substrate 1e facing the semiconductor light emitting device 30e. An opening 15e is formed through the levee film 14e and adhesion layer 12e to expose the connection member 10e at the bottom thereof. An opening 16e is formed through the levee film 14e and adhesion layer 13e to expose the connection member 11e at the bottom thereof.

In the seventh embodiment, the n-side led wiring layer 5e and p-side extension layer 4e along with the insulating film 112 as a dielectric layer constitute a capacitor. An electrostatic breakdown voltage can therefore be improved. A Zener diode or a varistor may be formed in advance in the underlying silicon substrate of the sub-mount substrate. These components are effective for the prevention of electrostatic breakdown.

The present invention has been described in connection with the preferred embodiments. The invention is not limited only to the above embodiments. It will be apparent to those skilled in the art that other various modifications, improvements, combinations, and the like can be made.

We claim:

1. A semiconductor device comprising:
    a semiconductor element having first and second electrodes formed on a first surface;
    a sub-mount substrate disposed so that a confronting surface of the sub-mount substrate faces the first surface of the semiconductor element, the sub-mount substrate having first and second extension layers disposed at positions facing the first and second electrodes;
    a levee film made of insulating material and disposed on the confronting surface of the sub-mount substrate, the levee film having first and second openings formed therethrough at positions corresponding to the first and second electrodes;
    a first connection member for electrically connecting the first electrode and the first extension layer via the first opening and not completely burying an inside of the first opening; and
    a second connection member for electrically connecting the second electrode and the second extension layer via the second opening and not completely burying an inside of the second opening;
    wherein the first electrode comprises a bottom portion facing the sub-mount substrate, the first connection member comprises a top portion facing the semiconductor element, a surface of the top portion of the first connection member is broader than a surface of the bottom portion of the first electrode, and the levee film is in tight adhesion to a partial area of the surface of the top portion of the first connection member via a first adhesion layer made of material enhancing tight adhesion therebetween.

2. The semiconductor device according to claim 1, wherein the levee film is made of a material selected from a group consisting of silicon oxide, alumina, titanium oxide, zirconia, hafnia and polyimide resin.

3. The semiconductor device according to claim 1, wherein a thickness of the levee film is 500 nm to 3000 nm.

4. The semiconductor device according to claim 1, wherein the first adhesion layer is made of a material selected from a group consisting of titanium, nickel and aluminum.

5. The semiconductor device according to claim 1, wherein the first and second connection members comprise a region made of conductive eutectic material of Au and Sn.

6. A method for manufacturing the semiconductor device according to claim 1, wherein in the semiconductor element, the first electrode comprises a third connection member and the second electrode comprises a fourth connection member, and the third and fourth connection members of the semiconductor element contact the first and second connection members, said method comprising:
    preparing the semiconductor element to include a substrate having the first and second electrodes formed on the first surface, such that the first electrode comprises the third connection member and the second electrode comprises the fourth connection member;
    preparing the sub-mount substrate to have the first and second extension layers on the confronting surface thereof;
    forming the first and second connection members at positions corresponding to the third and fourth connection members when the confronting surface of the sub-mount substrate is positioned to face the first surface of the semiconductor element;
    forming the first adhesion layer on the surface of the top portion of the first connection member;
    covering the first and second connection members, including the first adhesion layer, with the levee film made of insulating material, and forming the first and second openings through the levee film to expose upper surfaces of the first and second connection members, respectively, said first opening extending through the first adhesion layer such that the first adhesion layer is provided at the partial area of the surface of the top portion of the first connection member; and
    contacting the third connection member with the first connection member via the first opening and contacting the fourth connection member with the second connection member via the second opening, such that as viewed along a line of sight parallel to a normal to the first surface, the third connection member is positioned inside the first opening and the fourth connection member is positioned inside the second opening; and
    making eutectic a contact region between the third connection member and the first connection member and a contact region between the fourth connection member and the second connection member.

7. The method according to claim 6, wherein a volume of the third connection member is smaller than a volumetric capacity of the first opening, and a volume of the fourth connection member is smaller than a volumetric capacity of the second opening.

8. The method according to claim 6, wherein when the third connection member is made to contact the first connection member via the first opening and the fourth connection member is made to contact the second connection member via the second opening and the respective contact regions are made eutectic, a ring area surrounding the first opening and a ring area surrounding the second opening on an upper surface of the levee film are caused to contact portions of the first and second electrodes, respectively, other than the third and fourth connection members.

* * * * *